United States Patent
Deng et al.

(10) Patent No.: US 8,639,205 B2
(45) Date of Patent: Jan. 28, 2014

(54) REDUCED POWER-CONSUMPTION RECEIVERS

(75) Inventors: Junxiong Deng, San Diego, CA (US); Aristotele Hadjichristos, Cary, NC (US); Aleksandar Tasic, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1131 days.

(21) Appl. No.: 12/052,657

(22) Filed: Mar. 20, 2008

(65) Prior Publication Data

US 2009/0239592 A1 Sep. 24, 2009

(51) Int. Cl.
   *H04B 1/26* (2006.01)
(52) U.S. Cl.
   USPC ......... 455/323; 455/234.1; 455/334; 375/345
(58) Field of Classification Search
   USPC ........... 455/230, 232.1, 234.1, 255–260, 313, 455/323, 334; 375/345
   See application file for complete search history.

(56) References Cited

U.S. PATENT DOCUMENTS

| | | | |
|---|---|---|---|
| 3,212,024 A | 10/1965 | King, Jr. | |
| 3,212,027 A | 10/1965 | Wen-Hsiung | |
| 5,469,105 A | 11/1995 | Sparks | |
| 5,841,326 A | 11/1998 | Kitazono et al. | |
| 5,930,696 A | 7/1999 | Tzuang et al. | |
| 5,966,666 A | 10/1999 | Yamaguchi et al. | |
| 6,016,422 A | 1/2000 | Bartusiak | |
| 6,259,301 B1 | 7/2001 | Gailus et al. | |
| 6,266,517 B1 | 7/2001 | Fitzpatrick et al. | |
| 6,307,894 B2 | 10/2001 | Eidson et al. | |
| 6,356,746 B1 * | 3/2002 | Katayama | 455/324 |
| 6,487,398 B1 | 11/2002 | Nobbe et al. | |
| 6,590,438 B1 | 7/2003 | Manku et al. | |
| 6,906,996 B2 | 6/2005 | Ballantyne | |

(Continued)

FOREIGN PATENT DOCUMENTS

| | | |
|---|---|---|
| CN | 1136741 A | 11/1996 |
| CN | 1207835 A | 2/1999 |

(Continued)

OTHER PUBLICATIONS

Circa R et al: "Resistive MOSFET mixer for mobile direct conversion receivers" Microwave and Optoelectronics Conference, 2003. IMOC 2003. Proceedings of the 2003 SBMO/IEEE MTT-S International Sep. 20-23, 2003, Piscataway, NJ, USA,IEEE, US, vol. 3, Sep. 20, 2003, pp. 59-64, XP010687639 ISBN: 978-0-7803-7824-7.

(Continued)

*Primary Examiner* — Nhan Le
(74) *Attorney, Agent, or Firm* — Ramin Mobarhan (57) ABSTRACT

An exemplary embodiment disclosed comprises a mixer having a plurality of input leads; a first degenerative impedance element coupled to a first input lead of the mixer; a second degenerative impedance element coupled to a second input lead of the mixer; and a local oscillator (LO) system comprising a plurality of duty cycle modes to generate a LO signal for the mixer, the local oscillator system operates in a first duty cycle based on a first gain state of the mixer, and in a second duty cycle based on a second gain state of the mixer.

17 Claims, 7 Drawing Sheets

(56) References Cited

U.S. PATENT DOCUMENTS

| | | | |
|---|---|---|---|
| 6,985,033 | B1 | 1/2006 | Shirali et al. |
| 7,023,275 | B2 | 4/2006 | Miyamoto |
| 7,027,833 | B1 | 4/2006 | Goodman |
| 7,076,231 | B2 | 7/2006 | Yamawaki et al. |
| 7,092,676 | B2 | 8/2006 | Abdelgany et al. |
| 7,102,411 | B2 | 9/2006 | Behzad |
| 7,120,413 | B2 * | 10/2006 | Lee et al. .................. 455/260 |
| 7,139,547 | B2 | 11/2006 | Wakayama et al. |
| 7,151,919 | B2 | 12/2006 | Takalo et al. |
| 7,236,212 | B2 * | 6/2007 | Carr et al. .................. 348/726 |
| 7,277,689 | B2 | 10/2007 | Simon |
| 7,280,805 | B2 | 10/2007 | Xu et al. |
| 7,392,026 | B2 * | 6/2008 | Alam et al. ................ 455/180.1 |
| 7,457,605 | B2 * | 11/2008 | Thompson et al. ........... 455/313 |
| 7,460,844 | B2 | 12/2008 | Molnar et al. |
| 7,468,629 | B2 | 12/2008 | Chien |
| 7,573,347 | B2 | 8/2009 | Mayer et al. |
| 7,603,094 | B2 * | 10/2009 | Rahman et al. ............ 455/241.1 |
| 7,693,496 | B2 | 4/2010 | Lewis |
| 7,702,359 | B2 | 4/2010 | Tanaka et al. |
| 7,729,681 | B2 | 6/2010 | Someya |
| 7,750,749 | B2 | 7/2010 | Jones |
| 7,778,613 | B2 | 8/2010 | Seendripu et al. |
| 7,853,212 | B2 | 12/2010 | Van Waasen |
| 7,894,790 | B2 | 2/2011 | Gomez et al. |
| 7,899,426 | B2 | 3/2011 | Tasic et al. |
| 7,941,115 | B2 | 5/2011 | Aniruddhan et al. |
| 7,974,356 | B2 | 7/2011 | Rofougaran et al. |
| 8,019,310 | B2 | 9/2011 | Sahota et al. |
| 2002/0167369 | A1 | 11/2002 | Yamaji et al. |
| 2003/0155959 | A1 | 8/2003 | Belot et al. |
| 2004/0071225 | A1 | 4/2004 | Suzuki et al. |
| 2004/0127172 | A1 | 7/2004 | Gierkink et al. |
| 2004/0137862 | A1 | 7/2004 | Tanaka et al. |
| 2004/0253939 | A1 | 12/2004 | Castaneda et al. |
| 2005/0107055 | A1 | 5/2005 | Bult et al. |
| 2005/0117664 | A1 | 6/2005 | Adan et al. |
| 2005/0191976 | A1 | 9/2005 | Shakeshaft et al. |
| 2005/0220217 | A1 | 10/2005 | Yamawaki et al. |
| 2005/0282512 | A1 | 12/2005 | Yu |
| 2006/0038710 | A1 | 2/2006 | Staszewski et al. |
| 2006/0068746 | A1 | 3/2006 | Feng et al. |
| 2006/0119493 | A1 | 6/2006 | Tal et al. |
| 2006/0246862 | A1 | 11/2006 | Agarwal et al. |
| 2006/0261907 | A1 | 11/2006 | Efstathiou et al. |
| 2007/0015472 | A1 | 1/2007 | Murtojarvi et al. |
| 2007/0072558 | A1 | 3/2007 | Sridharan et al. |
| 2007/0096980 | A1 | 5/2007 | Gradincic et al. |
| 2007/0111697 | A1 | 5/2007 | Bellantoni |
| 2007/0142000 | A1 | 6/2007 | Herzinger |
| 2007/0238431 | A1 | 10/2007 | Zhan et al. |
| 2007/0247212 | A1 | 10/2007 | Zhang |
| 2007/0298750 | A1 | 12/2007 | Masuda |
| 2008/0014896 | A1 | 1/2008 | Zhuo et al. |
| 2008/0125060 | A1 | 5/2008 | Lin et al. |
| 2009/0023413 | A1 | 1/2009 | Xu et al. |
| 2009/0075620 | A1 | 3/2009 | Aniruddhan et al. |
| 2009/0190692 | A1 | 7/2009 | Aniruddhan et al. |
| 2009/0191825 | A1 | 7/2009 | Georgantas |
| 2009/0252252 | A1 | 10/2009 | Kim et al. |
| 2010/0029323 | A1 | 2/2010 | Tasic et al. |
| 2010/0190453 | A1 | 7/2010 | Rofougaran et al. |

FOREIGN PATENT DOCUMENTS

| | | |
|---|---|---|
| CN | 1726649 A | 1/2006 |
| CN | 1904773 A | 1/2007 |
| CN | 1981429 A | 6/2007 |
| CN | 101009491 A | 8/2007 |
| EP | 0276130 A2 | 7/1988 |
| EP | 1521376 A1 | 4/2005 |
| EP | 1760877 A1 | 3/2007 |
| EP | 1833161 A1 | 9/2007 |
| JP | 6165624 | 4/1986 |
| JP | 7202677 A | 8/1995 |
| JP | 9261102 A | 10/1997 |
| JP | 2000022575 A | 1/2000 |
| JP | 2000503826 | 3/2000 |
| JP | 2003032048 A | 1/2003 |
| JP | 2003188754 A | 7/2003 |
| JP | 2003283361 A | 10/2003 |
| JP | 2004289812 A | 10/2004 |
| JP | 2005057665 A | 3/2005 |
| JP | 2005136830 A | 5/2005 |
| JP | 2005159587 A | 6/2005 |
| JP | 2005184608 A | 7/2005 |
| JP | 2005244397 A | 9/2005 |
| JP | 2005294902 A | 10/2005 |
| JP | 2006014293 A | 1/2006 |
| JP | 2006114965 A | 4/2006 |
| JP | 2006222972 A | 8/2006 |
| JP | 2006279703 A | 10/2006 |
| JP | 2007074121 A | 3/2007 |
| JP | 2007522769 A | 8/2007 |
| JP | 3979237 B2 | 9/2007 |
| JP | 2008160327 A | 7/2008 |
| KR | 19990081842 | 11/1999 |
| TW | 566011 B | 12/2003 |
| TW | 200711312 | 3/2007 |
| TW | 200743336 | 11/2007 |
| TW | 200812308 A | 3/2008 |
| TW | 200822581 A | 5/2008 |
| WO | WO9726710 | 7/1997 |
| WO | 2005078916 A1 | 8/2005 |
| WO | WO2006002945 | 1/2006 |
| WO | WO2006117589 | 11/2006 |
| WO | WO2007053365 A1 | 5/2007 |
| WO | WO2008008759 | 1/2008 |

OTHER PUBLICATIONS

International Search Report & Written Opinion—PCT/US2009/037884, International Search Authority—European Patent Office—Jun. 30, 2009.

Razavi B et al: "Multiband UWB transceivers" Custom Integrated Circuits Conference, 2005. Proceedings of the IEEE 2005, IEEE, Piscataway, NJ, USA, Sep. 18, 2005, pp. 140-147, XP010873764 ISBN: 978-0-7803-9023-2.

Brenna G et al: "A 2GHz Carrier Leakage Calibrated Direct-Conversion WCDMA Transmitter in 0.13-<tex>$muhboxm$,/tex.CMOS" IEEE Hournal of Solid-State Circuits, IEEE vol. 39, No. 8, Aug. 1, 2004, pp. 1253-1262, XP011115212.

Farbod Behbahani et al: "A 2.4-GHz Low-If Receiver for Wideband WLAN in 0.6-m CMOS-Architecture and Front-End" IEEE Journal of Solid-State Circuits, IEEE Service Center, Piscataway, NJ, US, vol. 35, No. 12, pp. 1908-19161 Dec. 2000 (Dec. 1, 2000), XP011061384 ISSN: 0018-9200 section IV B figure 8a.

Kim, Bonkee et al: "A 2.6 V GSM/PCN Dual Band Variable Gain Low Noise RF Down Conversion Mixer" 2002 IEEE Radio Frequency Integrated Circuits Symposium, 2002, pp. 137-140, XP002508867 sections II and III figures 1-3.

Kim K et al., "A resistively degenerated wide-band passive mixer with low nioise figure and +60dBm IIP2 in 0.18 1/4 m CMOS" Radio Frequency Integrated Circuits Symposium, 2008. RFIC 2008, IEEE Piscataway, NJ, US, Jun. 17, 2008, pp. 185-188. ISBN: 978-1-4244-1808-4.

Mayer C, et al., "A Robust Gsm/Edge Transmitter Using Polar Modulation Techniques" Wireless Technology, 2005. The European Conference on CNIT LA Defense, Paris Oct. 3-4, 2005, Piscataway, NJ, USA,IEEE LNKDDOI: 10.1109/ECWT.2005.1617663, Oct. 3, 2005, pp. 103-106, XP010908871 ISBN: 978-2-9600551-1-5 figure 2.

Mccune E Ed—Maxim A: "Polar modulation and bipolar RF power devices" Bipolar/Bicmos Circuits and Technology Meeting, 2005. Proceedings of the, IEEE, Piscataway, NJ, USA LNKDDOI: 10.1109/BIPOL.2005.1555188, Oct. 9, 2005, pp. 1-5, XP010861821 ISBN: 978-0-7803-9309-7 figure 2.

Nguyen, et al., "A Low-Power RF Direct-Conversion Receiver/Transmitter for 2.4-GHz-Band IEEE 802.15.4 Standard in 0.18-.mu.m CMOS Technology," vol. 54, No. 12, Dec. 2006, pp. 4062-4071.

(56) References Cited

OTHER PUBLICATIONS

Rahim Bagheri et al., "An 800-MHz-6-GHz Software-Defined Wireless Receiver in 90-nm CMOS", IEEE Journal of Solid-State Circuits, IEEE Service Center, Piscataway, NJ, USA, vol. 41, No. 12, Dec. 1, 2006, pp. 2860-2876, XP011150713, ISSN: 0018-9200, DOI:10.1109/JSSC.2006.884835.

Wan, Jiansong, "Tunable Bandpass (1 .7-6)GHz Polyphase Filter in Near Zero IF Receiver," Philips, Jul. 2007.

Zhu, Yide, "Harmonic Rejection Mixer for Digital Video Broadcase-Handheld," Thesis, Delft University of Technology, Jun. 2007.

Ziv R, et al., "A phase correction technique applied to 700MHz a 6GHz complex demodulators in multi-band wireless systems" Microwaves, Communications, Antennas and Electronic Systems, 2008. Comcas 2008. IEEE International Conference on, IEEE, Piscataway, NJ, USA, May 13, 2008, pp. 1-8, XP031285366 ISBN: 978-1-4244-2097-1 the whole document.

Taiwan Search Report—TW098109242—TIPO—Aug. 7, 2012.

Jau, J.K., et al., "Highly efficient multimode RF transmitter using the hybrid quadrature polar modulation scheme," Microwave Symposium Digest, 2006, IEEE MTT-S International, Nov. 20, 2006.

\* cited by examiner

REDUCED POWER-CONSUMPTION RECEIVERS

FIELD

The present disclosure relates generally to receivers, and more specifically to techniques for reducing power consumption in radio frequency (RF) receivers.

BACKGROUND

In a communication system, a receiver receives a radio-frequency (RF) signal from a transmitter, and down-converts the received signal from RF to base-band using one or more mixers. Each mixer mixes the received signal with a local oscillator (LO) signal. An LO buffer is typically provided to buffer the LO signal before the mixer.

There are several different circuit topologies for realizing a wireless device receiver. Some topologies involve a surface acoustic-wave (SAW) filter that is disposed in the incoming RF signal path between a low-noise amplifier (LNA) and a mixer. It is desirable to be able to realize a wireless device receiver of adequate performance without using the somewhat costly and large SAW device. In order to achieve good linearity in a SAW-less receiver, a purely passive down-converting mixer is sometimes used. The passive mixer does not have an active gm-cell, such as a gain stage before the mixer's switching core. It is, however, often difficult for this topology to meet demanding noise figure (NF) requirements while still achieving good linearity (e.g., triple beat) performance.

One current approach to achieve good NF performance is to use a 25-duty-cycle (25DC) LO in RF receivers for better gain. Another approach is the use of a higher duty-cycle LO, such as a 50DC LO, which reduces power consumption compared to a 25DC but comes at the cost of reduced gain.

Accordingly, there is a need in the art for reducing the power consumption in receivers of wireless devices while maintaining acceptable NF.

DETAILED DESCRIPTION

The techniques described herein are applicable to and may be used for any electronic setting in any electrical or electronic environment in which radio frequency reception is desired. For exemplary purposes only, the exemplary embodiments described herein are presented in the context of a wireless communication environment, though they are not meant to be limited to such, but applicable to any wire or wireless communication setting which use radio-frequency transmission and reception, such as cell-phones, base-stations as well as cable set-top boxes and the likes.

The techniques described herein may be used for various wireless communication networks such as wireless communication networks such as CDMA, TDMA, FDMA, OFDMA and SC-FDMA networks. The terms "network" and "system" are often used interchangeably. A CDMA network may implement a radio technology such as Universal Terrestrial Radio Access (UTRA), cdma2000, etc. UTRA includes Wideband-CDMA (W-CDMA), Low Chip Rate (LCR), High Chip Rate (HCR), etc. CDMA2000 covers IS-2000, IS-95, and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. These various radio technologies and standards are known in the art. UTRA, E-UTRA and GSM are described in documents from an organization named "3rd Generation Partnership Project" (3GPP). CDMA2000 is described in documents from an organization named "3rd Generation Partnership Project 2" (3GPP2). 3GPP and 3GPP2 documents are publicly available. For clarity, certain aspects of the techniques are described below for 3GPP networks.

The word "exemplary" is used herein to mean "serving as an example, instance, or illustration." Any embodiment described herein as "exemplary" is not necessarily to be construed as preferred or advantageous over other embodiments.

Figure 1:
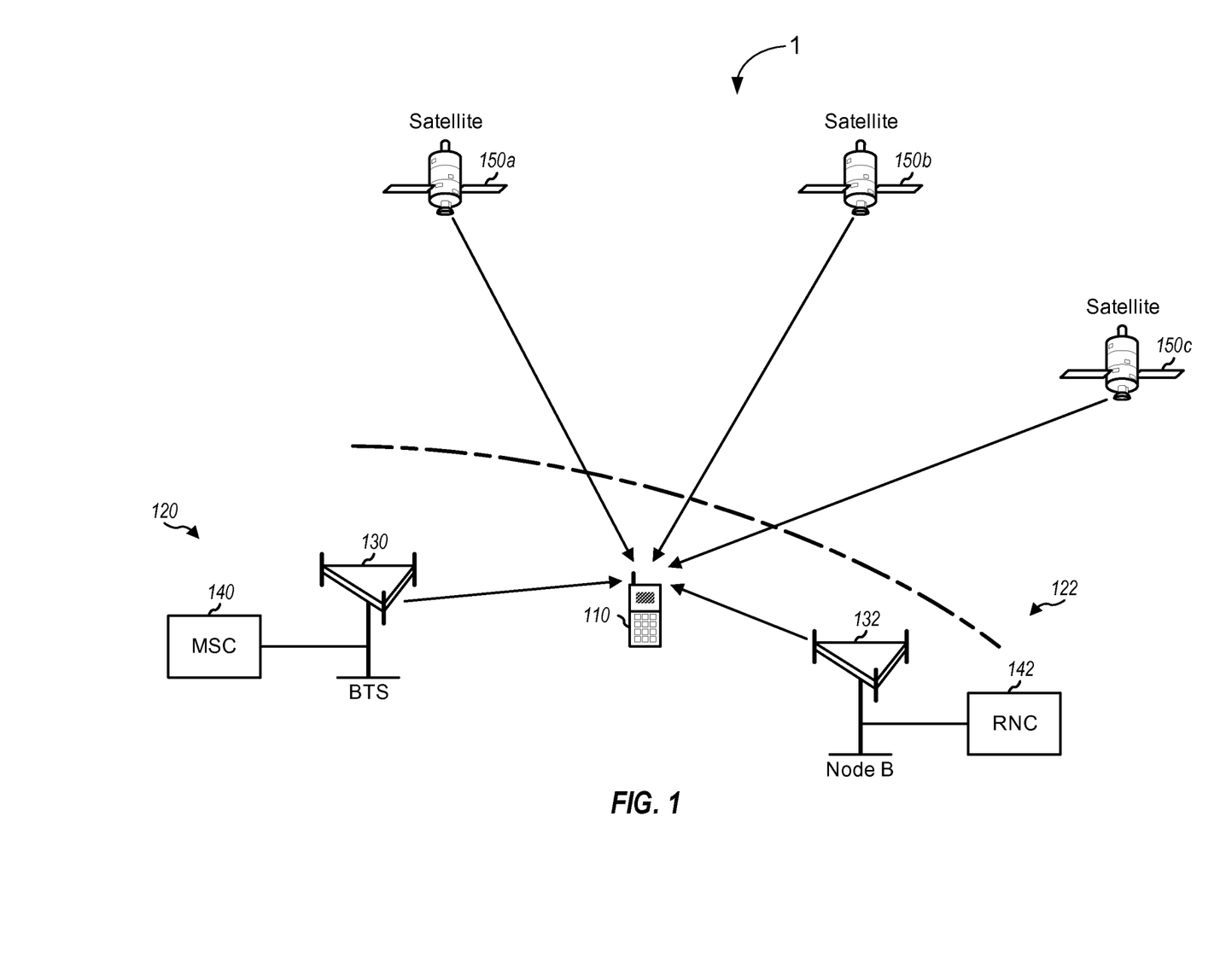
FIG. 1 illustrates an exemplary wireless communication environment in which exemplary embodiments of the disclosure can be practiced.

FIG. 1 illustrates an exemplary wireless communication environment 1 comprising communication systems 120 and 122 and a wireless device 110, such as a multi-antenna wireless device capable of communicating with multiple wireless communication systems 120 and 122. Wireless system 120 may be a CDMA system that may implement one or more CDMA standards such as, e.g., IS-2000 (commonly referred to as CDMA 1x), IS-856 (commonly referred to as CDMA 1x EV-DO), IS-95, W-CDMA, and so on. Wireless system 120 includes a base transceiver system (BTS) 130 and a mobile switching center (MSC) 140. BTS 130 provides over-the-air communication for wireless devices under its coverage area. MSC 140 couples to BTSs in wireless system 120 and provides coordination and control for these BTSs. Wireless system 122 may be a TDMA system that may implement one or more TDMA standards such as, e.g., GSM. Wireless system 122 includes a Node B 132 and a radio network controller (RNC) 142. Node B 132 provides over-the-air communication for wireless devices under its coverage area. RNC 142 couples to Node Bs in wireless system 122 and provides coordination and control for these Node Bs. In general, BTS 130 and Node B 132 are fixed stations that provide communication coverage for wireless devices and may also be referred to as base stations or some other terminology. MSC 140 and RNC 142 are network entities that provide coordination and control for the base stations and may also be referred to by other terminologies.

Wireless device 110 may be a cellular phone, a personal digital assistant (PDA), a wireless-enabled computer, or some other wireless communication unit or device. Wireless device 110 may also be referred to as a mobile station (3GPP2 terminology), a user equipment (UE) (3GPP terminology), an access terminal, or some other terminology. Wireless device 110 is equipped with multiple antennas, e.g., one external antenna and one or more internal antennas. The multiple antennas may be used to provide diversity against deleterious path effects such as fading, multipath, interference, and so on.

An RF modulated signal transmitted from an antenna at a transmitting entity may reach the multiple antennas at wireless device 110 via line-of-sight paths and/or reflected paths. At least one propagation path typically exists between the transmit antenna and each receive antenna at wireless device 110. If the propagation paths for different receive antennas are independent, which is generally true to at least an extent, then diversity increases and the received signal quality improves when multiple antennas are used to receive the RF modulated signal.

Wireless device 110 may or may not be capable of receiving signals from satellites 150. Satellites 150 may belong to a satellite positioning system such as the well-known Global Positioning System (GPS), the European Galileo system, or some other systems. Each GPS satellite transmits a GPS signal encoded with information that allows a GPS receiver on Earth to measure the time of arrival (TOA) of the GPS signal. Measurements for a sufficient number of GPS satellites may be used to obtain an accurate three-dimensional position estimate for the GPS receiver. In general, the wireless device 110 may be capable of communicating with any number of wireless systems of different wireless technologies (e.g., CDMA, GSM, GPS, and so on).

Figure 2:
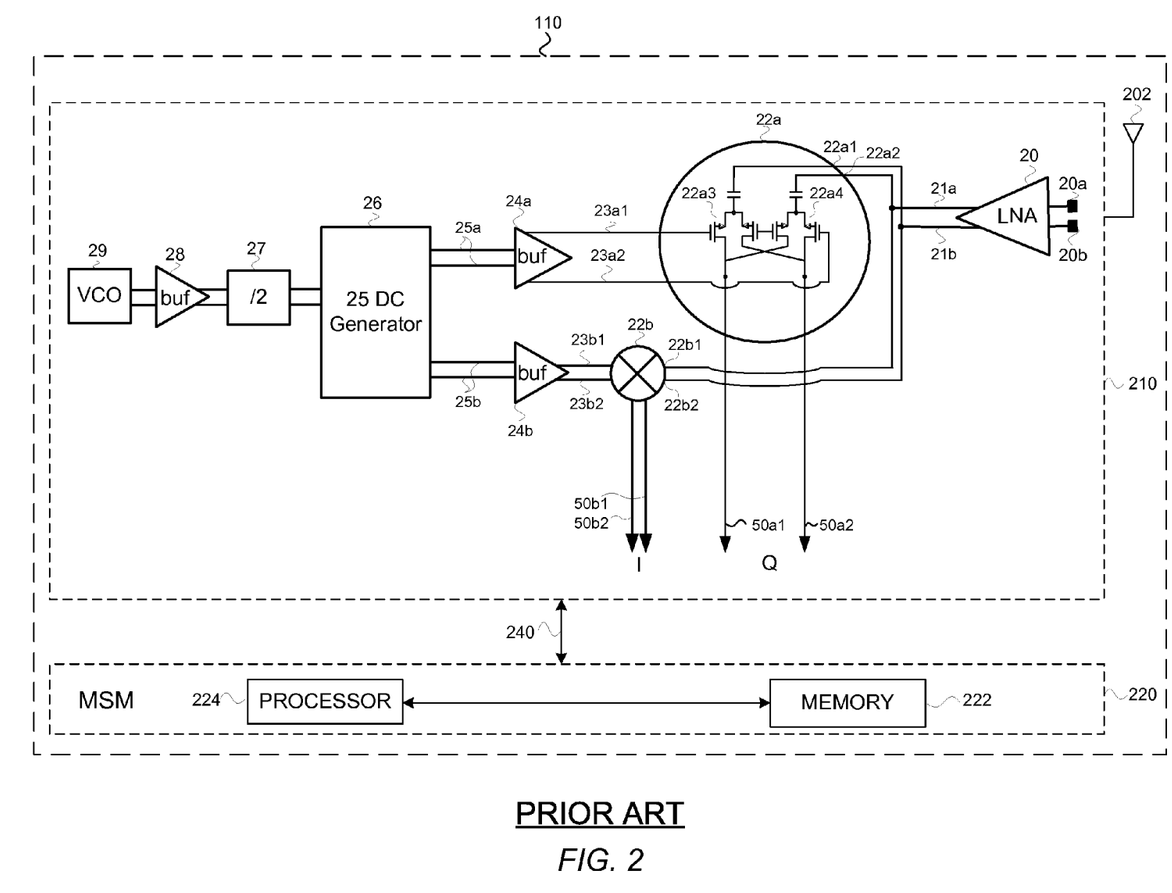
FIG. 2 illustrates an exemplary wireless device using prior art techniques.

FIG. 2 is a block diagram illustrating an exemplary wireless device 110. Wireless device 110 includes a transceiver system 210, such as a SAW-less transceiver, which at one end couples to an antenna 202, such as a main antenna, which may be an external antenna, and at the other end is in communication with a mobile station modem (MSM) 220, such as via path 240. MSM 220 comprises a processor 224 which is in communication with a memory 222.

As shown in FIG. 2, an incoming RF signal received in antenna 202 is received into the differential input terminals 20a and 20b of the low noise amplifier (LNA) 20. LNA 20 amplifies the RF signal and drives differential signals from output leads 21a and 21b. Output leads 21a and 21b of LNA 20 are coupled to the inputs of mixers 22a and 22b, for down-converting the RF signal, such as to base-band signals I and Q. Output lead 21a is coupled to a first differential input lead 22a2 of mixer 22a, and output lead 21b is coupled to a second differential input lead 22a1 of mixer 22a. In an exemplary embodiment, mixer 22a comprises a passive mixer having no active gm-cell, such as a gain stage before the mixer's switching core. In the exemplary embodiment shown in FIG. 2, the mixer 22a is a Gilbert Mixer which includes two cross-coupled switching elements 22a3 and 22a4, such as field effect transistors (FET), and whose configuration and operation is well known in the art. Similarly, Output lead 21a is coupled to a first differential input lead 22b1 of mixer 22b, and output lead 21b is coupled to a second differential input lead 22b2 of mixer 22b. In an exemplary embodiment, mixer 22b comprises a passive mixer having no active gm-cell, such as a gain stage before the mixer's switching core, and like mixer 22a comprises a Gilbert Mixer having two cross-coupled switching elements.

The transceiver system 210 also includes a voltage controlled oscillator 29 for generating a down-converting voltage signal which is first buffered in buffer 28, and then frequency divided by the frequency divider 27, such as divided by two. The output of the frequency divider 27 is then fed into the 25 duty cycle (DC) generator 26, which outputs 25DC signals 25a and 25b to buffers 24a and 24b, respectively. Buffers 24a and 24b then output buffered signals 23a1, 23a2 and 23b1, 23b2 to the mixers 22a and 22b respectively. Mixers 22a and 22b then respectively mix signals 23a1, 23a2 and 23b1, 23b2 with the RF signals received in their inputs 22a1, 22a2 and 22b1, 22b2, to generate down-converted Quadrature (Q) signals 50a1, 50a2 and In-phase (I) signals 50b1, 50b2, respectively. The down-converted I and Q signals are then provided to the MSM 220, such as via path 240.

As described above, a shortcoming in the above transceiver system 210 is that a 25DC LO consumes relatively high current resulting in higher consumption of power. Usage of a higher duty-cycle LO, such as a 50DC LO, however, can reduce power consumption but comes at the cost of reduced gain, resulting in degraded noise figure performance.

Figure 3:
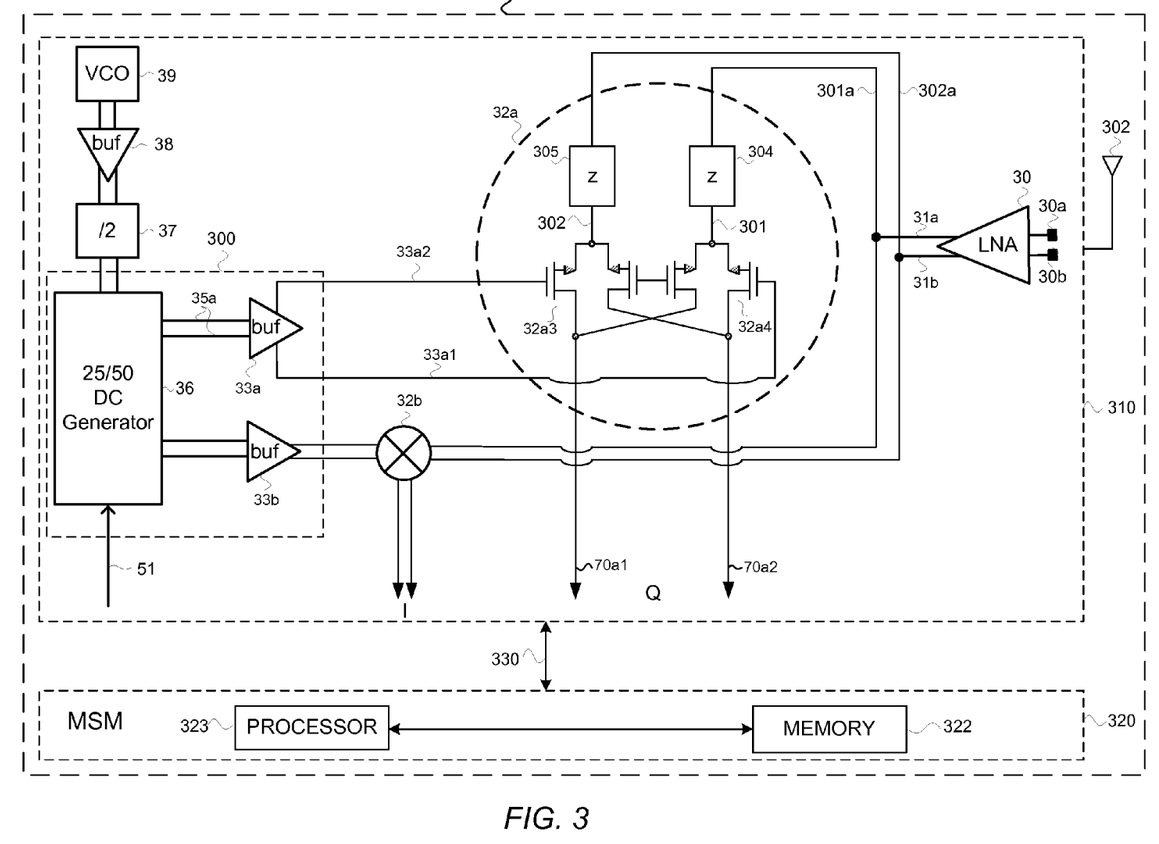
FIG. 3 illustrates an exemplary embodiment of the disclosure.

FIG. 3 illustrates an exemplary embodiment of the disclosure, described in the context of a SAW-less GSM transceiver system 310 for exemplary purposes only, but which can be used with other communication systems as well. As shown in FIG. 3, the transceiver system 310 couples to an antenna 302, such as a main antenna, which may be an external antenna, and is in communication with a mobile station modem (MSM) 320, such as via path 330. MSM 320 comprises a processor 323 which is in communication with a memory 322 which may be internal to MSM 320 as shown, or external to MSM 320 (not shown).

As shown in FIG. 3, the transceiver system 310 includes a mixer 32a, such as an active or passive mixer, for down-converting a RF signal, such as an Quadrature (Q) signal, first received on antenna 302, and then into the differential input terminals 30a and 30b of the low noise amplifier (LNA) 30, whose output leads 31a and 31b are then coupled to the mixer 32a. In an exemplary embodiment, LNA 30 is a variable gain amplifier. In an exemplary embodiment, mixer 32a comprises a passive mixer having no active gm-cell, such as a gain stage before the mixer's switching core. In the exemplary embodiment shown in FIG. 3, mixer 32a is a Gilbert Mixer which includes two cross-coupled switching elements 32a3 and 32a4, each having a plurality of transistors, such as field effect transistors (FET). Mixer 32a includes input leads 301 and 302, with degenerative impedance elements, such as 304 and 305, coupled to the input leads 301 and 302, respectively. In an exemplary embodiment, the degenerative impedance elements 304 and 305 are resistors having a resistance value greater than 20 ohms. The degenerative impedance elements 304 and 305 may be coupled to the input leads 301 and 302 internally to the mixer 32a, as shown, or externally (not shown) along the input paths 301a and 302a, respectively.

The transceiver system 310 further includes a local oscillator (LO) system 300 having a plurality of duty cycle modes to generate a LO signal for the mixer 32a. The local oscillator system 300 includes a multi-mode duty cycle (DC) generator 36, such as a programmable 25/50DC generator, that output LO signals 35a to a buffer 33a. Buffered signals 33a1 and 33a2 are then respectively provided to the switching elements 32a4 and 32a3 of the mixer 32a for down-converting of the RF signals received in the inputs leads 301 and 302, to down-converted signals outputted from output paths 70a2 and 70a1, respectively.

As described below in greater detail in conjunction with FIG. 5, the local oscillator system 300 operates in a first duty cycle based on a first gain state of the mixer 32a, and in a second duty cycle based on a second gain state of the mixer 32a. In an exemplary embodiment, a control signal 51 is received in the local oscillator system 300, such as from the processor 322, to provide instruction to the duty cycle generator 36 as to which duty cycle to operate in. In an exemplary embodiment, the duty cycle generator 36 is a programmable duty cycle generator. The transceiver system 310 also includes a voltage controlled oscillator 39 for generating a down-converting voltage signal which is then first buffered in buffer 38, and then frequency divided by the frequency divider 37, such as divided by two, before being fed into the local oscillator system 300.

As shown in FIG. 3, the transceiver system 310 may include additional mixers, such as a mixer 32b, for down-converting additional signals, such as In-Phase (I) signals. In an exemplary embodiment, each additional mixer, such as mixer 32b, also have degenerative impedance elements coupled to its inputs and also receives LO signals from the local oscillator system 300, having additional buffers, such as buffer 33b, which then operates based on the gains states of the mixers, such as both mixers 32a and 32b. For simplicity, the operation of the transceiver system 310 is described herein in detail only in the context of mixer 32a, but can be readily applied to a configuration having more than one mixer, such as mixers 32a and 32b.

Figure 4A:
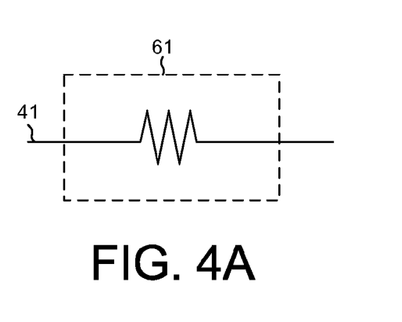
FIGS. 4A-G are exemplary circuit diagrams of degenerative impedance elements used in conjunction with the exemplary embodiments of the disclosure.
Figure 4B:
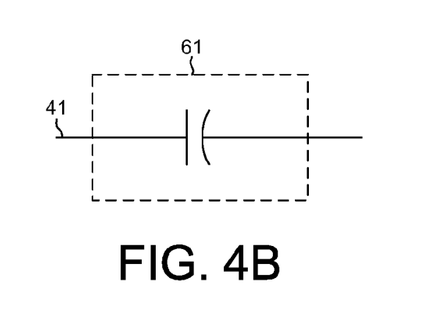
Figure 4C:
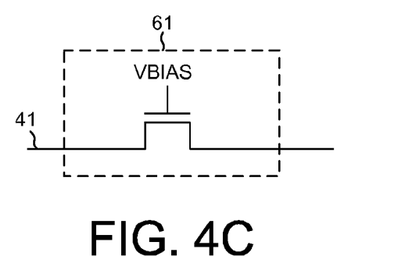
Figure 4D:
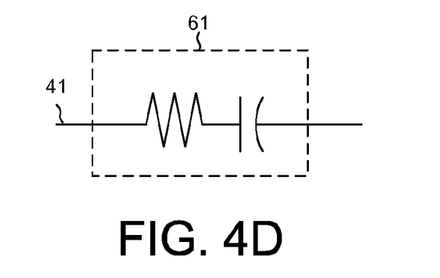
Figure 4E:
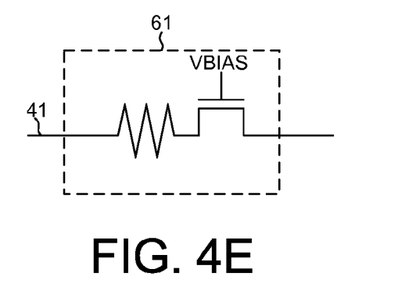
Figure 4F:
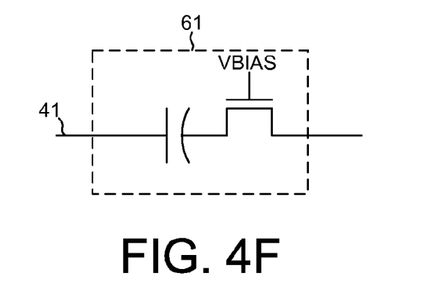
Figure 4G:
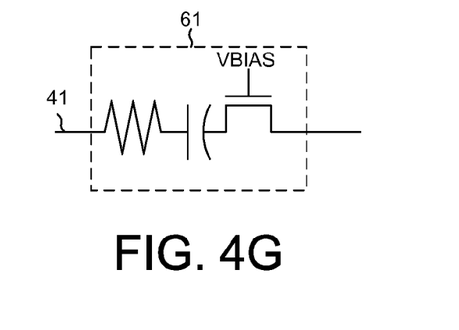

FIGS. 4A-G are exemplary circuit diagrams of degenerative impedance elements 61, with input leads 41, which may be used as degenerative impedance elements, such as 304 and 305, in the exemplary embodiments of the disclosure. In an exemplary embodiment, a degenerative impedance element 61 may include a resistor as shown in FIG. 4A, a capacitor as shown in FIG. 4B, a transistor as shown in FIG. 4C, a resistor and a capacitor coupled in series as shown in FIG. 4D, a resistor and a transistor coupled in series as shown in FIG. 4E, a capacitor and transistor coupled in series as shown in FIG. 4F, and a resistor and a capacitor and a transistor coupled together in series as shown in FIG. 4G.

Figure 5:
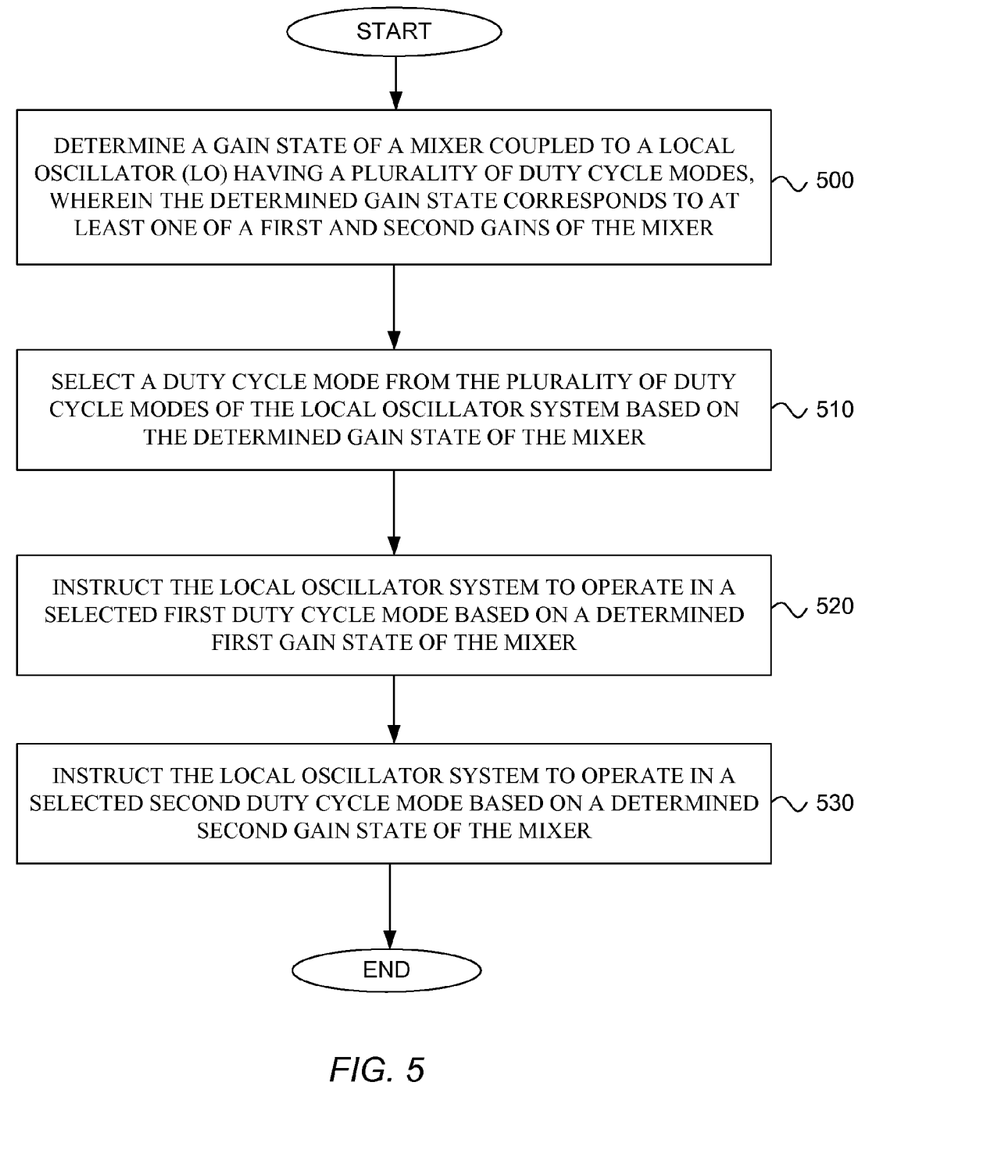
FIG. 5 is a flow chart illustrating an exemplary method of the disclosure.

FIG. 5 is a flow chart which in conjunction with FIG. 3, illustrates an exemplary method of the disclosure. The process begins in block 500 in which a gain state of a mixer, such as mixer 32a, is determined, such as by the processor 323. The mixer 32a is coupled to the local oscillator (LO) system 300 which has a plurality of duty cycle (DC) modes, such as 25DC and 50DC modes. Next, in block 510, a duty cycle mode is selected, such as by the processor 323, based on the determined gain state of the mixer 32a. In a configuration in which transceiver system 310 includes more than one mixer, such as mixers 32a and 32b, the duty cycle mode is selected based on the determined gained states of the mixers, such as mixers 32a and 32b. In an exemplary embodiment, the first gain state of the selected mixer(s) comprises a high gain state and the second gain of the selected mixer(s) comprises a low gain state.

Next, in block 520, the local oscillator system 300 is instructed, such as by the processor 323, to operate in a selected first duty cycle mode based on a determined first gain state of the mixer 32a. Next, in block 530, the local oscillator system 300 is instructed, such as by the processor 323, to operate in a selected second duty cycle mode based on a determined second gain state of the mixer. In an exemplary embodiment, the first duty cycle comprises a lower duty cycle rate than a duty cycle rate of the second duty cycle, such as 25DC and 50DC, respectively. The overall flow then ends.

Figure 6:
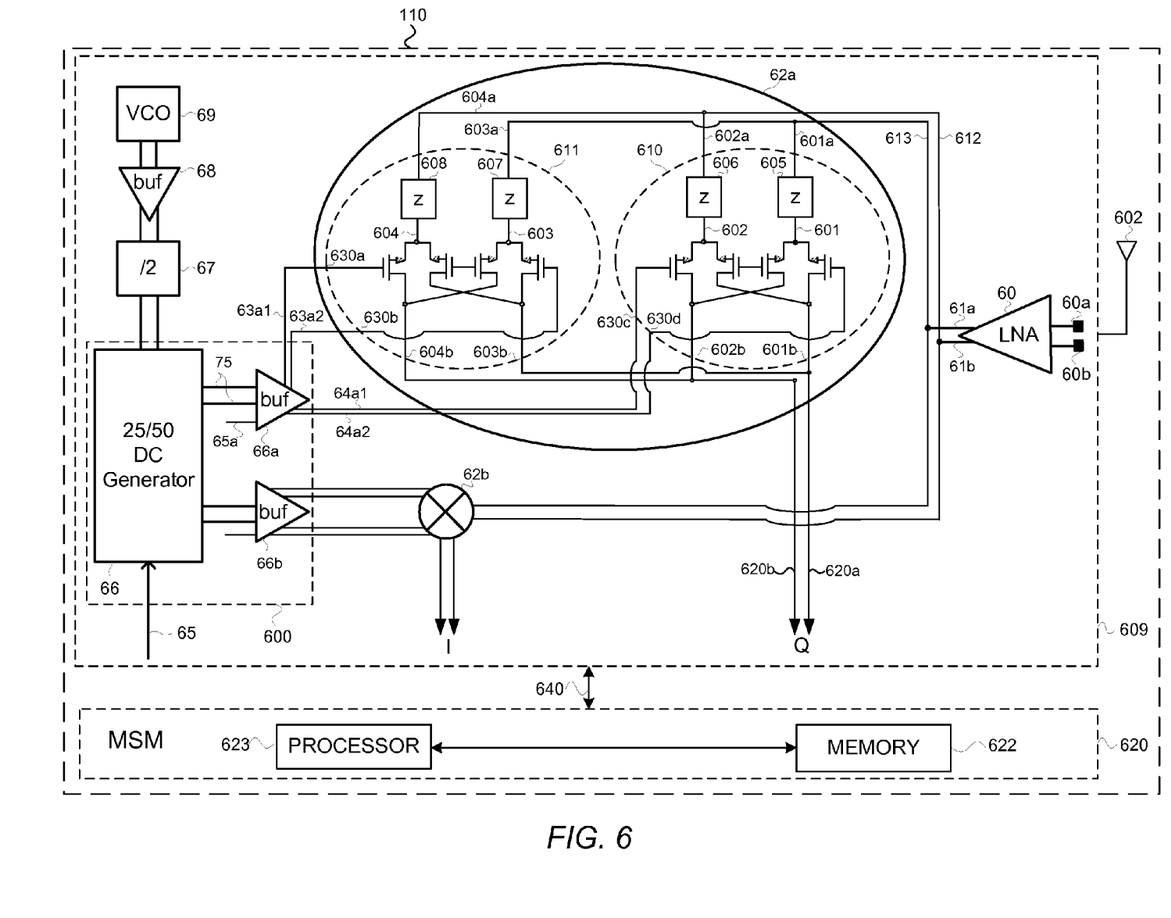
FIG. 6 illustrates another exemplary embodiment of the disclosure.

FIG. 6 illustrates an exemplary embodiment of the disclosure, described in the context of a SAW-less CDMA transceiver system 609 for exemplary purposes only, but which can be used with other communication systems as well. As shown in FIG. 6 the transceiver system 609 couples to an antenna 602, such as a main antenna, which may be an external antenna, and is in communication with a mobile station modem (MSM) 620, such as via path 640. MSM 620 comprises a processor 623 which is in communication with a memory 622 which may be internal or external to MSM 620.

As shown in FIG. 6, the transceiver system 609 includes a mixer 62a, such as an active or passive mixer, with two or more mixer cores, such as mixer cores 610 and 611, for down-converting a RF signal, such as a Quadrature (Q) signal. The RF signal is first received in antenna 602, and then into the differential input terminals 60a and 60b of the low noise amplifier (LNA) 60, whose output leads 61a and 61b are then coupled to the input leads 613 and 612 of mixer 62a, respectively. In an exemplary embodiment, LNA 60 is a variable gain amplifier. In an exemplary embodiment, one or more of the mixer cores 610 and 611 may be an active core or a passive core, such as a switching core. In the exemplary embodiment shown in FIG. 6, mixer 62a comprises a passive mixer having no gain stage before the switching cores 610 and 611, with mixer cores 610 and 611 each comprising a Gilbert Mixer having two cross-coupled switching elements, such as those described in conjunction with FIG. 3.

As shown in FIG. 6, each of the mixer cores 610 and 611 have a plurality of input leads, such as input leads 601 and 602 for mixer core 610, and input leads 603 and 604 for mixer core 611. In an exemplary embodiment, the input 612 of the mixer 62a is coupled to the input leads 602 and 604 of the mixer cores 610 and 611, respectively, and the input 613 of the mixer 62a is coupled to the input leads 601 and 603 of the mixer cores 610 and 611, respectively. The mixer 62a also includes outputs 620a and 620b, and each of the mixer cores 610 and 611 having a pair of outputs, such as outputs 601b and 602b for the mixer core 610, and 603b and outputs 604b for the mixer core 611. In an exemplary embodiment, the output 620b of the mixer 62a is coupled to the output leads 602b and 604b of the mixer cores 610 and 611, respectively, and the output 620a of the mixer 62a is coupled to the output leads 601b and 603b of the mixer cores 610 and 611, respectively.

Next, a degenerative impedance element is coupled to the input lead of each of mixer cores 610 and 611, such as degenerative impedance elements 605 and 606 coupled to the input leads 601 and 602 of the mixer core 610, respectively, and degenerative impedance elements 607 and 608 coupled to the input leads 603 and 604 of the mixer core 611, respectively. The degenerative impedance elements 605, 606, 607 and 608 may be respectively coupled to the input leads 601, 602, 603 and 604 either internally to the mixer cores 610 and 611, as shown, or externally (not shown) along their input paths 601a, 602a, 603a and 604a, respectively.

It should be noted that the number of mixer cores in the mixer 62a were selected as two for simplicity of description, but that mixer 62a can have more than two mixer cores. In an exemplary embodiment, one of the mixer cores is of a different impedance value from the other mixer cores in the mixer 62a, such as by a predetermined impedance ratio. In an exemplary embodiment, degenerative impedance elements of one mixer core are different than the degenerative impedance element of the other mixer cores, such as by a predetermined impedance ratio.

In the exemplary embodiment shown in FIG. 6, mixer core 610 is of a different impedance value than mixer core 611, such as by a predetermined impedance ratio of mixer core 610 to mixer core 611, with the degenerative impedance elements 605 and 606 of mixer core 610 being of different impedance value than the degenerative impedance elements 607 and 608 of mixer core 611, such as by a predetermined impedance ratio. In an exemplary embodiment, mixer core 610 is of a smaller impedance value than mixer core 611, such as by having a larger physical size than mixer core 611, such as by a predetermined size ratio of mixer core 610 to mixer core 611.

In an exemplary embodiment, each of the degenerative impedance elements 605, 606, 607 and 608 may comprise of a resistor, a capacitor, a transistor, a resistor and a capacitor coupled in series, a resistor and a transistor coupled in series, a capacitor and transistor coupled in series, and a resistor and a capacitor and a transistor coupled together in series, as shown an described above in conjunction with FIG. 4A-G.

As shown in FIG. 6, the transceiver system 609 also includes a voltage controlled oscillator 69 for generating a down-converting voltage signal which is first buffered in buffer 68, and then frequency divided by the frequency divider 67, such as divided by two, before being fed into the local oscillator (LO) system 600. The local oscillator (LO) system 600 has a plurality of duty cycle modes to generate a LO signal provided to the mixer 62a. The local oscillator system 600 includes a multi-mode duty cycle (DC) generator 66, such as a programmable 25/50DC generator, that output LO signals, such as via coupling lines 75 to a buffer system 66a which provides buffered signals to the mixer 62a. In an exemplary embodiment, the duty cycle generator 66 is a programmable duty cycle generator.

Figure 7:
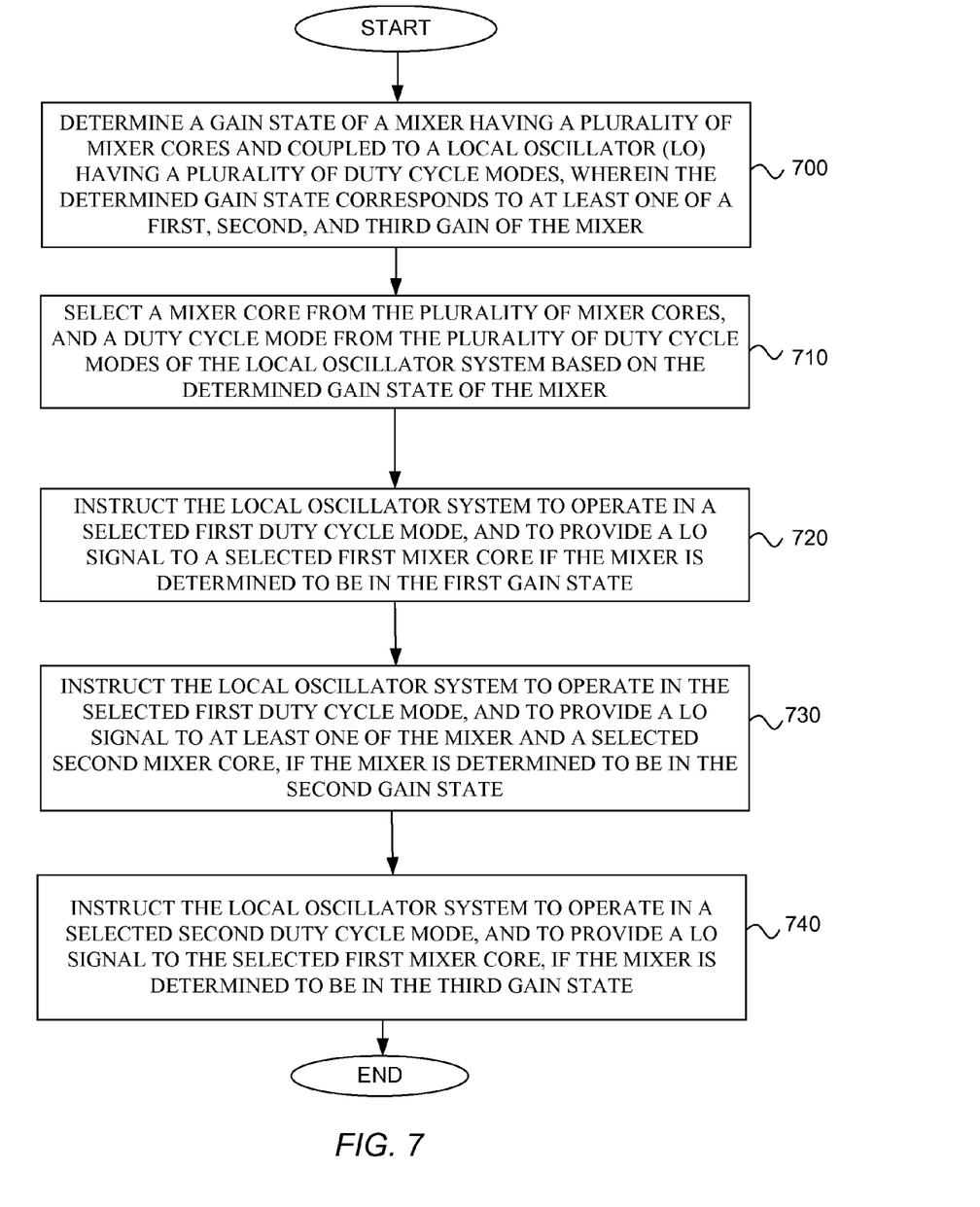
FIG. 7 is a flow chart illustrating another exemplary method of the disclosure.

As described in greater detail in conjunction with FIG. 7, a controller, such as processor 623 is then used to (a) operate a first mixer core, such as mixer core 611, and the local oscillator system 600 in a first duty cycle mode, such as 25DC, based on a first the gain of the mixer 62a, (b) operate either the mixer 62a or a second mixer core, such as mixer core 610, and the local oscillator system 600 in the first duty cycle mode, such as 25DC, based on a second gain of the mixer 62a, and (c) operate the first mixer core, such as mixer core 611, and the local oscillator system 600 in a second duty cycle mode, such as 50DC, based on a third gain of the mixer 62a. The instructions from a controller, such as the processor 623 are received in the multi-mode duty cycle (DC) generator 66 which will then operate in the instructed duty cycle mode.

In an exemplary embodiment, buffer system 66a includes input leads coupled to corresponding output leads of the duty cycle generator system 66, such as via coupling lines 75. Buffer system 66a also includes a first set of output leads 63a1 and 63a2 coupled to a corresponding input leads 630a and 630b of mixer core 611 to provide the mixer 62a with an LO signal corresponding to one of the duty cycles of the multi-mode duty cycle (DC) generator 66. Buffer system 66a also includes a second set of output leads 64a1 and 64a2 coupled to input leads of mixer core 610 to provide the mixer 62a with a signal corresponding to the one of the duty cycles of multi-mode duty cycle (DC) generator 66. Buffered signals are then provided by pairs 63a1, 63a2, and 64a1, 64a2 to the switching elements of the mixer cores 611 and 610, respectively, for down-converting of the RF signals received in the inputs leads 612 and 613, to down-converted signals outputted from outputs 620b and 620a, respectively.

In an exemplary embodiment, the buffer system 66a includes two sub-buffers (not shown), with each sub-buffer outputting from a different pair of the output leads of the buffer system 66a, such as output leads 63a1, 63a2 and 64a1, 64a2. In an exemplary embodiment, the sub-buffers are of different sizes corresponding to the different sizes of the mixer cores 610 and 611, and are selected based on a control signal received via control line 65a from a controller, such as the processor 623. Selection of a sub-buffer via control line 65a enables the selected sub-buffer to provide to its corresponding mixer core an LO signal corresponding to one of the duty cycles of the multi-mode duty cycle (DC) generator 66, whereas other mixer cores are not provided with an LO signal from their corresponding sub-buffers. For example if a sub-buffer corresponding to mixer core 610 is selected, the selected sub-buffer provides an LO signal to the mixer core 610 via output leads 64a1 and 64a2, while no LO signal is provided via output leads 63a1 and 63a2 to the mixer core 611 by the other not selected sub-buffer.

As shown in FIG. 6, the transceiver system 609 may include additional mixers, such as a mixer 62b, for down-converting additional signals, such as In-Phase (I) signals. In an exemplary embodiment, each additional mixer, such as mixer 62b, also has a plurality of mixer cores like mixer 62a as described above, each with degenerative impedance elements coupled to their inputs and also receive LO signals from the local oscillator system 600 which then operates based on the gains states of the mixers, such as both mixers 62a and 62b. The local oscillator system 600 will also have additional buffer systems for the additional mixers, such as buffer system 66b for mixer 62b. For simplicity, the operation of the transceiver system 609 is described herein in detail only in the context of mixer 62a, but can be readily applied to a configuration having more than one mixer.

In addition, each mixer, such as mixers 62a and 62b, may include more than two mixer cores and a corresponding number of sub-buffers of different sizes in theirs buffer systems 66a and 66b, respectively. In an exemplary embodiment having a multi-mixer and multi-mixer core per mixer configuration, the local oscillator (LO) system 600 generates a LO signal provided to the mixers. As described below and in greater detail in conjunction with FIG. 7, a controller, such as processor 623, then: (a) operates corresponding first mixer cores in each of the mixers, and the local oscillator system 600 in a first duty cycle mode based on a first gain of the mixers, (b) operates the mixers or a corresponding second mixer cores in each of the mixers, and the local oscillator system 600 in the first duty cycle mode based on a second gain of the mixers, and (c) operates the corresponding first mixer cores in each of the mixers and the local oscillator system 600 in a second duty cycle mode based on a third gain of the mixers.

FIG. 7 is a flow chart which in conjunction with FIG. 6, illustrates another exemplary method of the disclosure. The process begins in block 700 in which is determined a gain state of a mixer, such as mixer 62a, having a plurality of mixer cores, such as mixer cores 610 and 611, and coupled to a local oscillator (LO) 600 which has a plurality of duty cycle (DC) modes, such as 25DC and 50DC modes. The determined gain state corresponds to a first, second, or third gain of the mixer.

In an exemplary embodiment, the first gain state of the mixer comprises a high gain state, such as a high gain low-linearly (G0LL) state in a CDMA 1x receiver, the second gain of the mixer comprises a low gain state, such as a low gain high-linearly (G0HL) state in a CDMA 1x receiver, and the third gain state comprises a low gain state lower than the second gain of the mixer, such as a low gain state G1, G2 or G3 in CDMA 1x receiver.

Next, in block 710, based on the determined gain state of the mixer, such as mixer 62a, a mixer core in the mixer, such as mixer core 610 or 611, is selected, as well as a duty cycle mode of the local oscillator system 600, such as 25DC or 50DC modes. In an exemplary embodiment, the selection of the mixer core and duty cycle is performed by a controller, such as processor 623.

Next, in block 720, if the mixer, such as mixer 62a, is determined to be in the first gain state, such as in a high gain low-linearly (G0LL) state in a CDMA 1x receiver, the local oscillator system 600 is then instructed by a controller, such as processor 623, to operate in a low duty cycle mode, such as 25DC, and to provide a LO signal to a selected mixer core of the mixer, such as mixer core 611. In an exemplary embodiment, the selected mixer core, such as mixer core 611, comprises a larger impedance value than a non-selected mixer core, such as mixer core 610. A controller, such as processor

623, instructs the duty cycle generator 66 to operate in a lower duty cycle mode, such as 25DC mode, based on a control signal received in the duty cycle generator 66 via control line 65. A controller, such as processor 623, also instructs the buffer system 66a based on a control signal received in the buffer system 66a via control line 65a, to provide LO signal to the selected mixer core by via either output leads 64a1, 64a2 or 63a1, 63a2, depending on which mixer core is selected. In another exemplary embodiment, LO signal is provided to a selected mixer core via one or more multiplexers (not shown) placed along paths to one or more inputs of one or more mixer cores, such as along paths to inputs 601a, 602a, 630c and 630d of mixer core 610, based on instructions from a controller, such as processor 623.

Next, in block 730, if the mixer, such as mixer 62a, is determined to be in the second gain state, such as a low gain high-linearly (G0HL) state in a CDMA 1x receiver, the local oscillator system 600 is then instructed by a controller, such as processor 623, to operate in a low duty cycle mode, such as 25DC, and to provide a LO signal to either the mixer 62a by selecting both mixer cores 610 and 611, or to just a selected mixer core. In an exemplary embodiment, the selected mixer core, such as mixer core 610, comprises a smaller impedance value than a non-selected mixer core, such as mixer core 611. A controller, such as processor 623, instructs the duty cycle generator 66 to operate in a lower duty cycle mode, such as 25DC mode, based on a control signal received in the duty cycle generator 66 via control line 65. A controller, such as processor 623, also instructs the buffer system 66a based on a control signal received in the buffer system 66a via control line 65a, to provide LO signal to the selected mixer core by via either output leads 64a1, 64a2 or 63a1, 63a2, depending on which mixer core is selected, or to both mixer cores if both mixer cores are selected. In another exemplary embodiment, LO signal is provided to a selected mixer or mixer core via one or more multiplexers (not shown) placed along paths to one or more inputs of one or more mixer cores, such as along paths to inputs 601a, 602a, 630c and 630d of mixer core 610, based on instructions from a controller, such as processor 623.

Next, in block 730, if the mixer, such as mixer 62a, is determined to be in the third gain state, such as a low gain state G1, G2 or G3 in CDMA 1x receiver, the local oscillator system 600 is then instructed by a controller, such as processor 623, to operate in a higher duty cycle mode, such as 50DC, and to provide a LO signal to a selected mixer core. In an exemplary embodiment, the selected mixer core, such as mixer core 611, comprises a larger impedance value than a non-selected mixer core, such as mixer core 610. A controller, such as processor 623, instructs the duty cycle generator 66 to operate in a higher duty cycle mode, such as 50DC mode, based on a control signal received in the duty cycle generator 66 via control line 65. A controller, such as processor 623, also instructs the buffer system 66a based on a control signal received in the buffer system 66a via control line 65a, to provide LO signal to the selected mixer core by via either output leads 64a1, 64a2 or 63a1, 63a2, depending on which mixer core is selected. In another exemplary embodiment, LO signal is provided to a selected mixer or mixer core via one or more multiplexers (not shown) placed along paths to one or more inputs of one or more mixer cores, such as along paths to inputs 601a, 602a, 630c and 630d of mixer core 610, based on instructions from a controller, such as processor 623. The overall flow then ends.

Compared to 50DC local oscillators, RF receivers with a 25DC local oscillators achieve higher gain if LNA consumes the same current. Higher gain in the receiver front end is highly desired for better noise-figure (NF) in RF receivers, especially in SAW-less ones which have no gm-cell, such as a gain stage before the mixer's switching core. In most wireless communication systems, the most challenging NF is required only in high gain modes. One the other hand, low gain modes are the most power dominant modes. To reduce power consumption in low gain modes and still meet relaxed NF specifications will make RF receiver the more power efficient. One advantage of embodiments of the invention over the prior art is that by using a 25DC LO in high gain modes and a 50DC LO in low gain modes more power efficiency and achieved as well as better NF for high gain modes.

It should be noted that the various exemplary embodiments were discussed separately for purposes of illustrations, but that they may be combined in one embodiment having some or all of the features of the separately illustrated embodiments.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

It should be noted that the methods described above can be implemented in computer program product having a computer-readable medium with code for causing a computer to perform the above described processes. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. An apparatus comprising:
   a mixer comprising a plurality of mixer cores;
   a local oscillator (LO) system comprising a plurality of duty cycle modes to generate a LO signal provided to the mixer; and
   a controller to (a) operate a first mixer core from the plurality of mixer cores and the local oscillator system in a first duty cycle mode based on a first gain of the mixer, (b) operate at least one of the mixer and a second mixer core from the plurality of mixer cores, and the local oscillator system in the first duty cycle mode based on a second gain of the mixer, and (c) operate the first mixer core and the local oscillator system in a second duty cycle mode based on a third gain of the mixer.

2. The apparatus of claim 1, wherein at least one mixer core in the plurality of mixer cores comprises a different impedances value from the other mixer cores in the plurality of mixer cores.

3. The apparatus of claim 2, wherein the first mixer core is of a smaller impedance value than the second mixer core.

4. The apparatus of claim 1, wherein each of the mixer cores having a plurality of input leads, wherein a first degenerative impedance element is coupled to a first input lead of a first mixer core, a second degenerative impedance element is coupled to a second input lead of the first mixer core; a third degenerative impedance element is coupled to a first input lead of a second mixer core; and a fourth degenerative impedance element is coupled to a second input lead of the second mixer core.

5. The apparatus of claim 4, wherein each of the first, second, third and fourth degenerative impedance elements comprising at least one of a resistor, a capacitor, a transistor, a resistor and a capacitor coupled in series, a resistor and a transistor coupled in series, a capacitor and transistor coupled in series, and a resistor and a capacitor and a transistor coupled together in series.

6. The apparatus of claim 4, wherein the mixer comprising a first input and a second input, and the first input of the mixer comprising the first input leads of the mixer cores and the second input of the mixer comprising the second leads of the mixer cores.

7. The apparatus of claim 4, wherein the mixer comprising a first output and a second output, wherein the plurality of mixer cores each comprising a first output and a second output, and wherein the first output of the mixer comprising the first outputs of the mixer cores and the second output of the mixer comprising the second outputs of the mixer cores.

8. The apparatus of claim 1, further comprising:
   a low noise amplifier (LNA) having a plurality of output leads each coupled to a corresponding input lead of the mixer.

9. The apparatus of claim 8, wherein the LNA comprising a variable gain LNA.

10. The apparatus of claim 1, wherein each of the plurality of mixer cores comprising at least one of an active core and a passive core.

11. The apparatus of claim 1, the local oscillator (LO) system further comprising a duty cycle generator system to generate duty cycles corresponding to the first and the second duty cycle modes.

12. The apparatus of claim 11, the local oscillator (LO) system further comprising a buffer system comprising:
   a plurality of input leads each coupled to a corresponding output lead in the plurality of output leads of the duty cycle generator system;
   a first plurality of output leads coupled to a corresponding first plurality of input leads of the first mixer core of the mixer to provide the mixer with a signal corresponding to at least one of the first and second duty cycles based on a control signal received from the controller; and
   a second plurality of output leads coupled to a corresponding second plurality of input leads of the second mixer core of the mixer to provide the mixer with a signal corresponding to at least one of the first and second duty cycles based on a control signal received from the controller.

13. The apparatus of claim 1, wherein the first gain state of the mixer comprises a high gain state, the second gain of the mixer comprises a low gain state, and the third gain state comprise a low gain state lower than the second gain of the mixer.

14. The apparatus of claim 1, further comprising:
a plurality of mixers each comprising a plurality of mixer cores; wherein the local oscillator (LO) system generates a LO signal provided to the plurality of mixers, and wherein the controller (a) operates the first mixer cores from the plurality of mixer cores in each of the plurality of mixers, and the local oscillator system in a first duty cycle mode based on a first gain of the plurality of mixers, (b) operates at least one of the plurality of mixers and second mixer cores from the plurality of mixer cores in each of the plurality of mixers, and the local oscillator system in the first duty cycle mode based on a second gain of the plurality of mixers, and (c) operate the first mixer cores from the plurality of mixer cores and the local oscillator system in a second duty cycle mode based on a third gain of the plurality of mixers.

15. A method comprising:
determining a gain state of a mixer having a plurality of mixer cores and coupled to a local oscillator (LO) having a plurality of duty cycle modes, wherein the determined gain state corresponds to at least one of a first, second, and third gain of the mixer;
selecting a mixer core from the plurality of mixer cores, and a duty cycle mode from the plurality of duty cycle modes of the local oscillator system based on the determined gain state of the mixer;
instructing the local oscillator system to operate in a selected first duty cycle mode, and to provide a LO signal to a selected first mixer core if the mixer is determined to be in the first gain state;
instructing the local oscillator system to operate in the selected first duty cycle mode, and to provide a LO signal to at least one of the mixer and a selected second mixer core, if the mixer is determined to be in the second gain state; and
instructing the local oscillator system to operate in a selected second duty cycle mode, and to provide a LO signal to the selected first mixer core, if the mixer is determined to be in the third gain state.

16. A computer program product comprising:
computer-readable medium comprising:
code for causing a computer to determine a gain state of a mixer having a plurality of mixer cores and coupled to a local oscillator (LO) having a plurality of duty cycle modes, wherein the determined gain state corresponds to at least one of a first, second, and third gain of the mixer;
code for causing the computer to select a mixer core from the plurality of mixer cores, and a duty cycle mode from the plurality of duty cycle modes of the local oscillator system based on the determined gain state of the mixer;
code for causing the computer to instruct the local oscillator system to operate in a selected first duty cycle mode, and to provide a LO signal to a selected first mixer core if the mixer is determined to be in the first gain state;
code for causing the computer to instruct the local oscillator system to operate in the selected first duty cycle mode, and to provide a LO signal to at least one of the mixer and a selected second mixer core, if the mixer is determined to be in the second gain state; and
code for causing the computer to instruct the local oscillator system to operate in a selected second duty cycle mode, and to provide a LO signal to the selected first mixer core, if the mixer is determined to be in the third gain state.

17. An apparatus comprising:
means for determining a gain state of a mixer having a plurality of mixer cores and coupled to a local oscillator (LO) having a plurality of duty cycle modes, wherein the determined gain state corresponds to at least one of a first, second, and third gain of the mixer;
means for selecting a mixer core from the plurality of mixer cores, and a duty cycle mode from the plurality of duty cycle modes of the local oscillator system based on the determined gain state of the mixer; and
means for instructing the local oscillator system to operate in a selected first duty cycle mode, and to provide a LO signal to a selected first mixer core if the mixer is determined to be in the first gain state; to operate in the selected first duty cycle mode, and to provide a LO signal to at least one of the mixer and a selected second mixer core, if the mixer is determined to be in the second gain state; and to operate in a selected second duty cycle mode, and to provide a LO signal to the selected first mixer core, if the mixer is determined to be in the third gain state.

* * * * *